United States Patent
Breitwisch et al.

(10) Patent No.: US 7,910,911 B2
(45) Date of Patent: Mar. 22, 2011

(54) PHASE CHANGE MEMORY WITH TAPERED HEATER

(75) Inventors: Matthew Breitwisch, Yorktown Heights, NY (US); Thomas Happ, Tarrytown, NY (US); Eric A. Joseph, White Plains, NY (US); Hsiang-Lan Lung, Hsinchu (CN); Jan Boris Philipp, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/511,602

(22) Filed: Jul. 29, 2009

(65) Prior Publication Data

US 2009/0289242 A1 Nov. 26, 2009

Related U.S. Application Data

(62) Division of application No. 11/771,501, filed on Jun. 29, 2007.

(51) Int. Cl.
  *H01L 47/00* (2006.01)
(52) U.S. Cl. .............................. 257/4; 438/102; 257/536
(58) Field of Classification Search .................. 438/102; 257/2–4, 246, 536, E27.004
See application file for complete search history.

(56) References Cited

U.S. PATENT DOCUMENTS

| 6,114,713 | A | 9/2000 | Zahorik | |
|---|---|---|---|---|
| 6,228,668 | B1 * | 5/2001 | Silverbrook | ..................... 438/21 |
| 6,287,919 | B1 | 9/2001 | Zahorik | |
| 2003/0189200 | A1 * | 10/2003 | Lee et al. | ........................... 257/1 |
| 2004/0197947 | A1 * | 10/2004 | Fricke et al. | .................. 438/102 |
| 2006/0169968 | A1 | 8/2006 | Happ | |
| 2007/0096162 | A1 * | 5/2007 | Happ et al. | ..................... 257/246 |

OTHER PUBLICATIONS

Park "Writing Current Reduction in Phase Change Memory Device with U-shaped Heater (PCM-U)", Japanese Journal of Applied Physics, vol. 45, No. 20, 2006, pp. L516-L518.*
S. Lai et al., "OUM—A 180 nm Nonvolatile Memory Cell Element Technology for Stand Alone and Embedded Applications," IEDM 2001, pp. 36.5.1-36.5.4.
S. Lai, "Current Status of Phase Change Memory and Its Future," IEDM 2003, pp. 10.1.1-10.1.4.
Y.H. Ha et al., "An Edge Contact Type Cell for Phase Change RAM Featuring Very Low Power Consumption," 2003 Symposium on VLSI Technology Digest of Technical Papers, pp. 175-176.
H. Horii et al., "A Novel Cell Technology Using N-Doped GeSbTe Films for Phase Change RAM," 2003 Symposium on VLSI Technology Digest of Technical Papers, pp. 177-178.

* cited by examiner

*Primary Examiner* — Alexander G Ghyka
*Assistant Examiner* — Leonard Chang
(74) *Attorney, Agent, or Firm* — Vazken Alexanian; Ryan, Mason & Lewis, LLP

(57) ABSTRACT

An embodiment of the present invention includes a phase change memory (PCM) structure configurable for use as a nonvolatile storage element. The element includes at least one bottom electrode; at least one phase change material layer on at least a portion of an upper surface of the bottom electrode; and at least one heater layer on at least a portion of an upper surface of the phase change material layer, wherein the heater layer has a tapered shape such that an upper surface of the heater layer has a cross-sectional width that is longer than a cross-sectional width of a bottom surface of the heater layer contacting the phase change material layer.

10 Claims, 5 Drawing Sheets

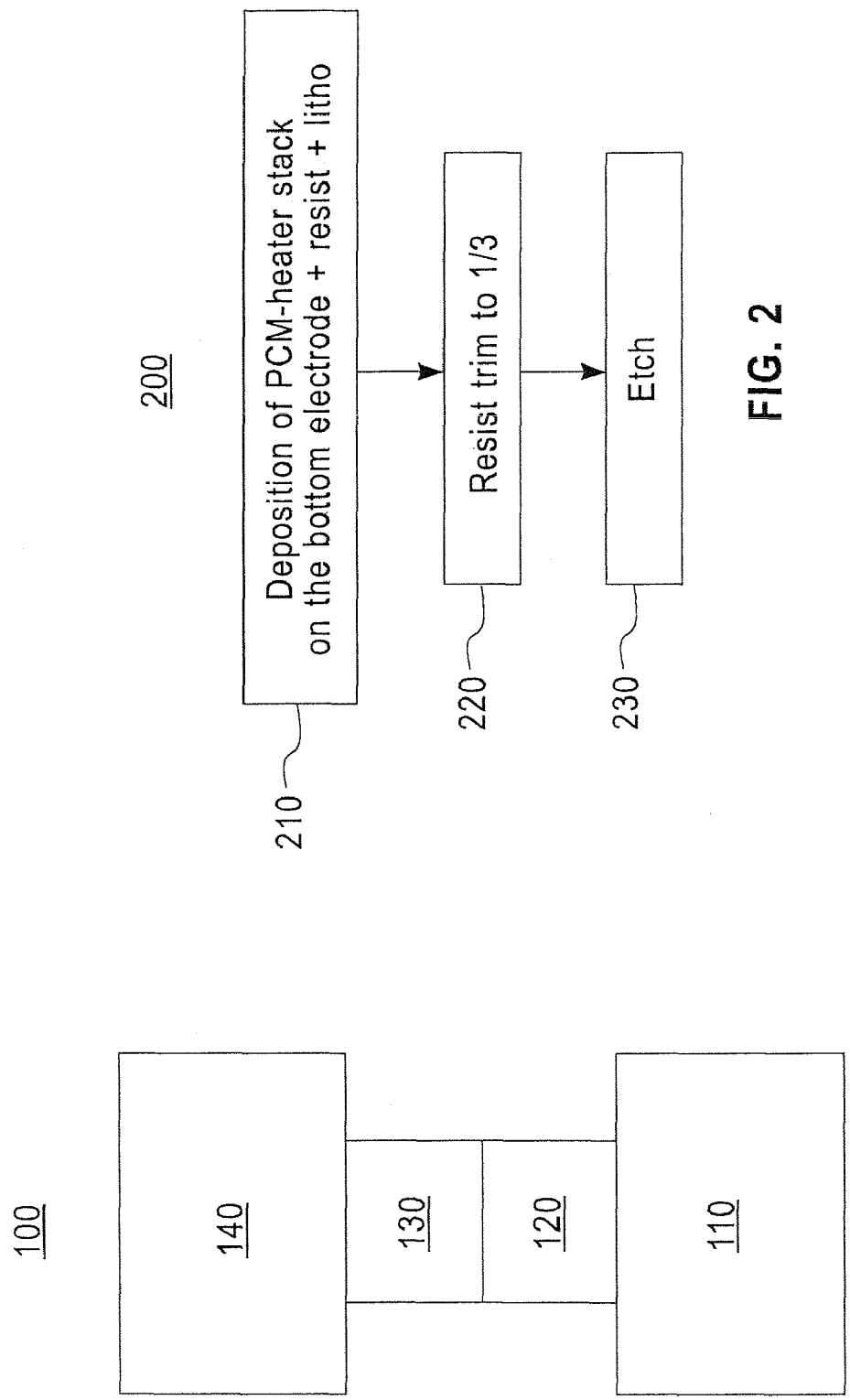

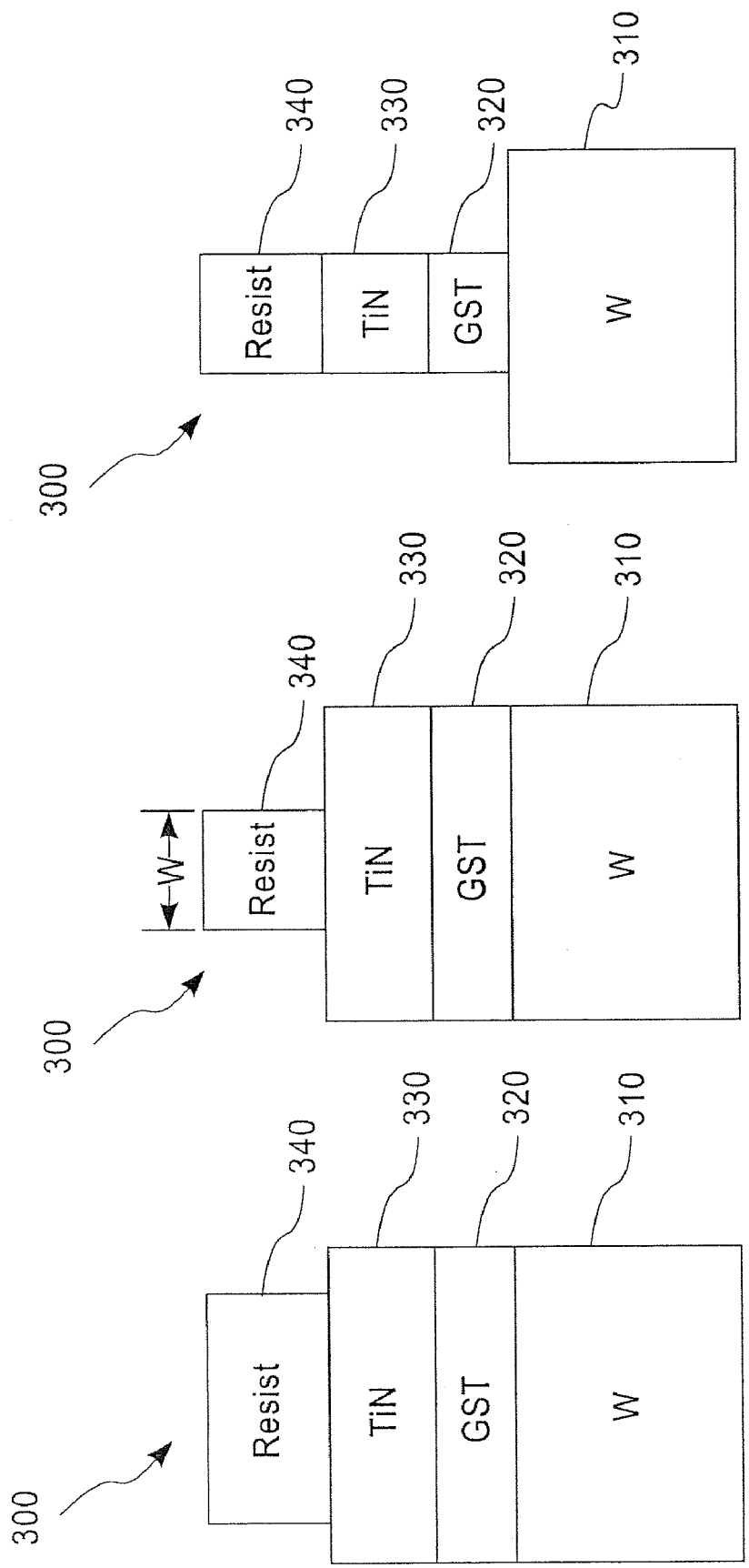

PHASE CHANGE MEMORY WITH TAPERED HEATER

CROSS-REFERENCE TO RELATED APPLICATION(S)

This application is a divisional of pending U.S. application Ser. No. 11/771,501, filed Jul. 29, 2007, the disclosure of which is incorporated by reference herein.

FIELD OF THE INVENTION

The present invention relates generally to memory devices, and more particularly relates to phase change memory cells.

BACKGROUND OF THE INVENTION

Non-volatile memory is an integral part of many electronic devices from mobile phones, digital cameras, and set-top boxes, to automotive engine controllers primarily because of its ability to store data even when power is turned off. One type of non-volatile memory, namely, phase change memory (PCM), is aimed at eventually supplanting flash memory technology which is used abundantly in such electronic devices. Modern phase change random access memory (PRAM) typically requires that a PCM cell employed therein be compatible with existing field-effect transistor (FET) technology. However, PCM cell volume must be very small so as to ensure that set and reset currents in the PCM cell are smaller then a maximum FET current, which is difficult to achieve using present complementary metal-oxide semiconductor (CMOS) fabrication technology, such as, for example, a 90 nanometer (nm) process.

As is known, PCM cells are generally based on storage elements which utilize a class of materials, such as chalcogenides, that has the property of switching between two distinct states, the electrical resistance of which varies according to the crystallographic structure of the material. A high-resistance, reset state is obtained when an active region of the phase change (PC) material is in an amorphous phase, whereas a low-resistance, set state is obtained when the PC material is in a crystalline or polycrystalline phase. The PC material can be selectively switched between the two phases by application of set and reset currents to the PCM cell.

Reducing the amount of current required by a PC material layer to change its crystalline phase can beneficially decrease power dissipation and improve reliability during operation of the PCM cell. Consequently, attempts have been made to define current flow in the PCM cell so as to provide more efficient self-heating (e.g., Joule heating) of the PC material in the cell. Existing solutions for defining current flow in a PCM cell, which in turn defines an active PCM cell volume, rely predominantly on pushing lithography and etching capabilities to their limits. Presently, existing lithography, including, for example, deep ultraviolet (DUV), e-beam, etc., is limited to a line resolution of about 45 nm. Such lithography techniques are already challenging, especially when forming small features having an island shape (preferably circular).

In particular, one of the smallest elements in a conventional PCM cell is a heater which is typically located on one side of the PC material. The small heater is often challenging to manufacture, and thus adds significantly to the cost of the PCM cell. A conventional technique for forming the heater requires a trim of a photoresist mask to ⅓ of the size of the lithography node. Such an aggressive trim is not very reliable and is difficult to control in a homogeneous fashion over a wafer.

Accordingly, there exists a need for improved techniques for defining current flow in a PCM cell that does not suffer from one or more of the problems exhibited by conventional PCM cells.

SUMMARY OF THE INVENTION

An embodiment of the present invention includes a method of forming a nonvolatile PCM cell. This method includes forming at least one bottom electrode; forming at least one phase change material layer on at least a portion of an upper surface of the bottom electrode; forming at least one heater layer on at least a portion of an upper surface of the phase change material layer; and shaping the heater layer into a tapered shape, such that an upper surface of the heater layer has a cross-sectional width that is longer than a cross-sectional width of a bottom surface of the heater layer contacting the phase change material layer.

Another embodiment of the present invention includes a phase change memory (PCM) structure configurable for use as a nonvolatile storage element. The element includes at least one bottom electrode; at least one phase change material layer on at least a portion of an upper surface of the bottom electrode; and at least one heater layer on at least a portion of an upper surface of the phase change material layer, wherein the heater layer has a tapered shape such that an upper surface of the heater layer has a cross-sectional width that is longer than a cross-sectional width of a bottom surface of the heater layer contacting the phase change material layer.

Another embodiment of our invention includes a nonvolatile storage cell, comprising at least one phase change memory (PCM) structure with the features described above. Another embodiment of our invention includes an integrated circuit including at least one phase change memory (PCM) structure configurable for use as a nonvolatile storage element with the features described above.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 1 is a cross-sectional view of an exemplary prior art PCM-based memory cell with a sub-lithographic pillar.

FIG. 2 is a simplified flow diagram showing an exemplary prior art method for forming a memory cell.

FIGS. 3A-3C show sectional views of an exemplary PCM-based memory cell during various stages of formation under the method shown in FIG. 2.

DETAILED DESCRIPTION OF THE INVENTION

Figure 4:
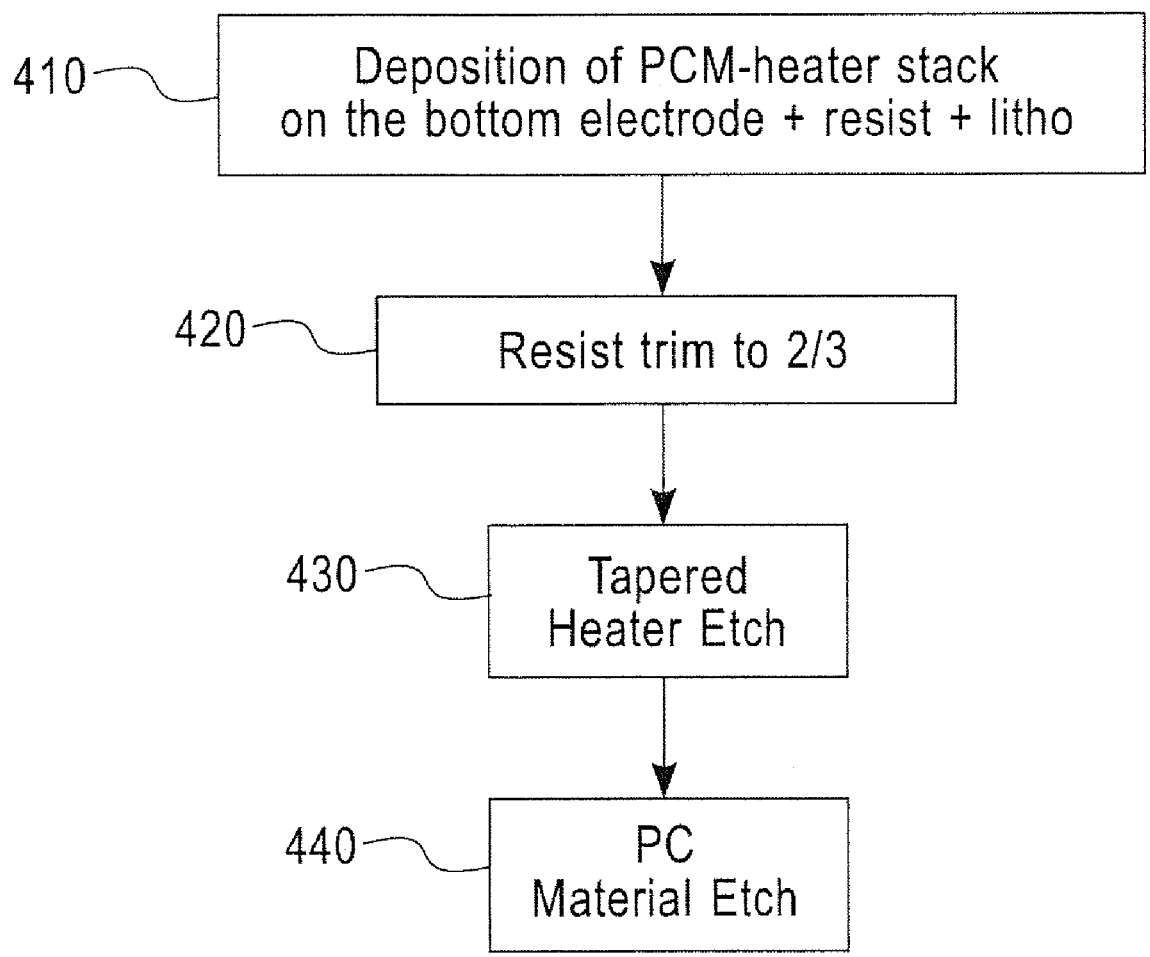
FIG. 4 is a simplified flow diagram showing an exemplary method for forming a memory cell according to inventive technique.

This invention will be illustrated herein in conjunction with exemplary memory cells for use in integrated circuits and methods for forming such memory cells. It should be understood, however, that the invention is not limited to the particular materials, features and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described herein for economy of description. However one skilled in the art will readily recognize those processing steps omitted from these generalized descriptions.

One skilled in the art will also recognize that integrated circuits are typically formed in semiconductor wafers (i.e., substrates) that have two substantially flat surfaces before processing is initiated. The vertical direction is defined herein to be a direction perpendicular to these flat surfaces. In contrast, the horizontal or lateral direction is defined to be a direction parallel to these flat surfaces. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

What is more, the term "phase change material" as used herein is intended to encompass any material displaying more than one programmable electrical resistance state for use in integrated circuits. It is recognized that this definition may encompass more materials than are customarily included within this term. PC materials as used herein comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$ and $TiO_x$, as well as other suitable materials.

It should also be understood that the various layers and/or regions shown in the accompanying figures are not drawn to scale, and that one or more layers and/or regions of a type commonly used in integrated circuits may not be explicitly shown in a given figure for economy of description. For example, those integrated circuit features associated with what is commonly referred to as the front-end-of-line and middle-of-line are not described herein. This does not imply that the layers and/or regions not explicitly shown are omitted from the actual integrated circuit.

FIG. 1 is a cross-sectional view depicting at least a portion of an exemplary PCM cell 100. The exemplary PCM cell 100 comprises a bottom electrode 110, a PC material layer 120, formed on an upper surface of the bottom electrode, a heater layer 130, and a top electrode 140 formed on an upper surface of at least a portion of the dielectric layer 130. It is to be appreciated that, in accordance with other aspects of the invention, the PCM structure 100 may comprise more or less than two electrode layers, one PC material and/or more than one heater layer. It may also comprise, for example, other layers not shown here, such as, for example, one or more dielectric layers and/or one or more conductive barrier layers.

Bottom and top electrodes 110, 140 provide access to the PCM structure 100 by providing electrical connection to PC material layer 120. The bottom and top electrodes 110, 140 are preferably formed of an electrically conductive material, such as, but not limited to, a metal, an alloy, a metal oxynitride, and/or a conductive carbon compound. For example, the top and bottom electrodes 110, 140 may comprise aluminum (Al), copper (Cu), tungsten (W), titanium (Ti), tantalum (Ta), titanium nitride (TiN), tantalum nitride (TaN), molybdenum (Mo), niobium (Nb), WN, MoN, NbN, TiSiN, TiAlN, MoAlN, TaSiN, TaAlN, TiW, TaSi, and/or TiSi. The two electrodes 110, 140 need not be formed of the same material. In a preferred embodiment, the top and bottom electrodes comprise tungsten.

The PC material layer 120 is preferably comprised of a chalcogenide material, or alternative material exhibiting two distinct phases of differing resistivities. Chalcogenide materials suitable for use with the present invention include, but are not limited to, tellurium (Te), selenium (Se), germanium (Ge), antimony (Sb), bismuth (Bi), lead (Pb), tin (Sn), arsenic (As), sulfur (S), silicon (Si), phosphorus (P), any mixture thereof, and/or any alloy thereof. In a preferred embodiment of the invention, the PC material layer 120 comprises $Ge_2Sb_2Te_5$ (GST).

Storing data in the memory cell 100 comprises placing some portion of the total volume of the PC material layer 120 (the "switchable volume") into either a lower electrical resistance polycrystalline state or a higher electrical resistance amorphous state. Transitions between these states are accomplished by heating the switchable volume of the PC material by applying a pulse of switching current to the memory cell 100 through the bottom and top electrodes 110, 140. The duration of the switching current pulse is preferably between about one and about 500 nanoseconds and has a fast falling edge (e.g., less than about five nanoseconds), although the invention is not limited to any particular duration and/or rise or fall time of the switching current pulse. The fast falling edge acts to freeze the switchable volume of the PC material in its current electrical resistance state without allowing additional time for the bonds within the material to continue to rearrange.

Subsequently, reading the state of the memory cell 100 can be accomplished by applying a sensing voltage to the memory cell, again via the bottom and top electrodes 110, 140. The ratio of the electrical resistances between the higher and lower electrical resistance states in a typical PCM cell is between about 100:1 and 1,000:1. The sensing voltage is preferably of low enough magnitude to provide negligible ohmic heating in the PC material layer 120. Accordingly, the electrical resistance state of the PC material can be determined in this manner without disturbing its written electrical resistance state. Data integrity is thereby maintained while reading the data.

The heater 130 is preferably composed of an electrically conductive material which is chemically inert when in contact with the materials used for the PC material layer 120 and top electrode 140. Examples of such electrically conductive but chemically inert materials include carbon, TiN, and TaN. Both titanium nitride and tantalum nitride display a low diffusion rate for metallic elements. As a result, forming the heater 130 out of these materials keeps metallic elements contained in the top electrode from diffusing into the PC material. In a preferred embodiment where the PC material layer 120 is GST, the heater 130 is preferably composed of TiN. When a signal is applied to the bottom and top electrodes 110, 140 of the PCM structure 100, at least a region of the PC material layer 120 proximate to the heater 130 will experience a current density resulting in self-heating of the PC material. When the applied signal reaches a certain threshold so as to cause a localized heating of the PC material proximate the heater 130 to a certain critical temperature value, a phase transition of at least a portion of the PC material will occur.

FIG. 2 is a simplified flow diagram showing an illustrative method 200 for forming a PCM cell and FIGS. 3A-3C show cross-sectional views of a PCM cell 300 during various stages of formation under the method shown in FIG. 2.

The method 200 begins in step 210 with the deposition upon a bottom electrode 310 of a PC material layer 320, a heater material layer 330, and a photoresist mask layer 340. Said deposition may be accomplished using a variety of thin-film deposition methods known to those skilled in the art, including, but not limited to, physical vapor deposition (PVD), chemical vapor deposition (CVD), electrochemical deposition (ECD), molecular beam epitaxy (MBE), or atomic layer deposition (ALD). This particular arrangement is merely illustrative and a number of other arrangements would still come within the scope of the invention, as will be familiar to one skilled in the art.

In step 220, the photoresist mask layer 340 may be trimmed to be about one-third (⅓) of its originally deposited cross-sectional width, W, thus resulting in the configuration shown in FIG. 3B. This amount of trimming can approach or even exceed the resolution limits of the lithographic process used to fabricate the PCM cell. As previously stated, trimming the photoresist mask layer to one-third of its original size presents considerable design challenges in that such an aggressive trim is not very reliable and is difficult to control in a homogeneous manner across a wafer. In step 230, an anisotropic etching technique, preferably reactive ion etching (RIE), is used to remove portions of the heater material layer 330 and/or PC material layer 320 where the photoresist mask layer 340 is not present.

After stripping the photoresist mask layer 340, other processing steps may be performed. For example, a barrier layer (not shown) may be deposited and/or a top electrode layer (not shown) may be formed, e.g. by deposition, photolithography and RIE, or, in an embodiment in which the top electrode layer is copper, by a damascene process (e.g., patterning of silicon dioxide, copper deposition and chemical mechanical polishing (CMP)).

FIG. 4 is a simplified flow diagram showing an exemplary method 400 for forming a PCM cell and FIGS. 5A-5D show cross-sectional views of a PCM cell 500 during various stages of formation using method 400, in accordance with an embodiment of the invention.

The method begins in step 410 with the deposition of a PC material layer 520 on at least a portion of an upper surface of a bottom electrode 510 of PCM cell 500, the deposition of a heater material layer 530 on at least a portion of an upper surface of the PC material layer, and the deposition of a photoresist mask layer 540 on at least a portion of an upper surface of the PC material layer. Said deposition may be accomplished using a variety of thin-film deposition methods known to those skilled in the art, included but not limited to physical vapor deposition (PVD), chemical vapor deposition (CVD), electrochemical deposition (ECD), molecular beam epitaxy (MBE), or atomic layer deposition (ALD). Alternative deposition techniques are similarly contemplated. This particular arrangement is merely illustrative and a number of other arrangements would still come within the scope of the invention, as will be familiar to those skilled in the art.

Figure 5A:
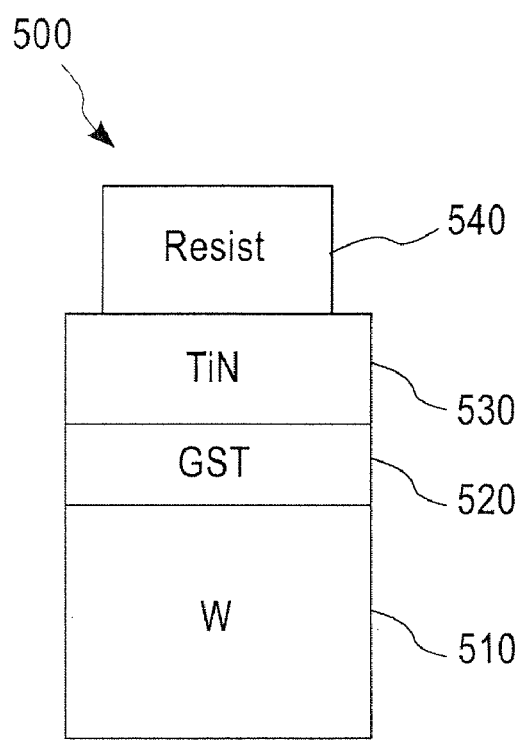
FIGS. 5A-5D show sectional views of an exemplary PCM-based memory cell during various stages of formation under the method shown in FIG. 6.
Figure 5B:
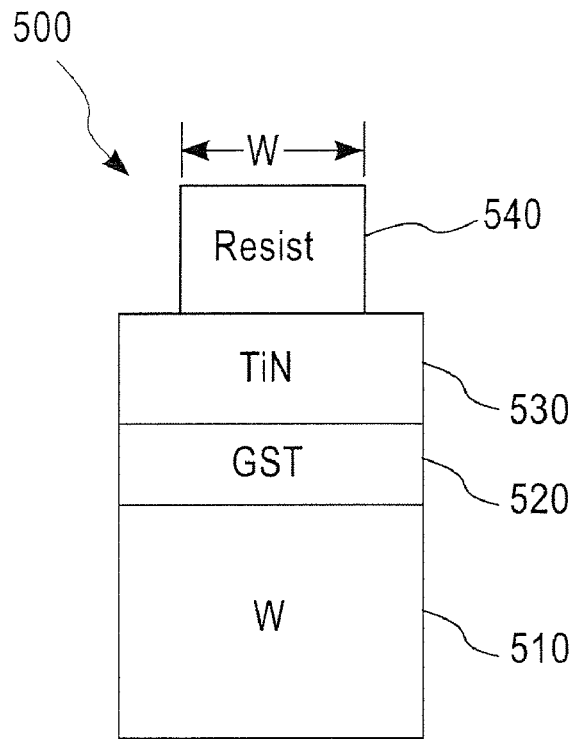
Figure 5C:
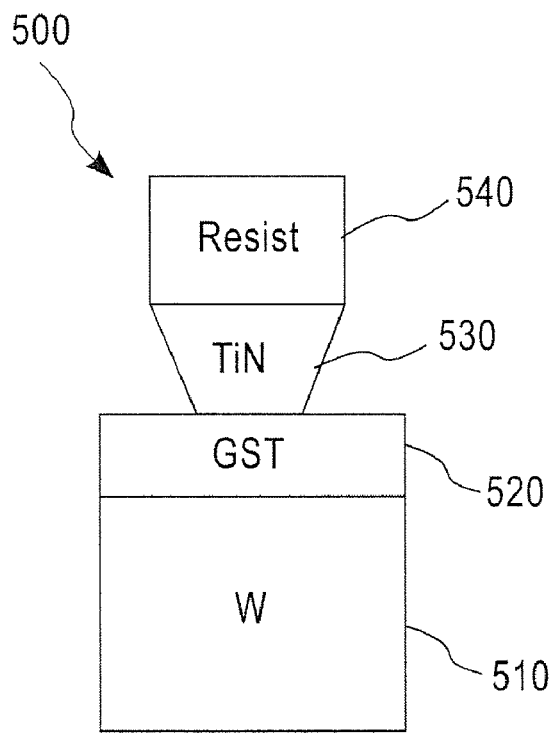
Figure 5D:
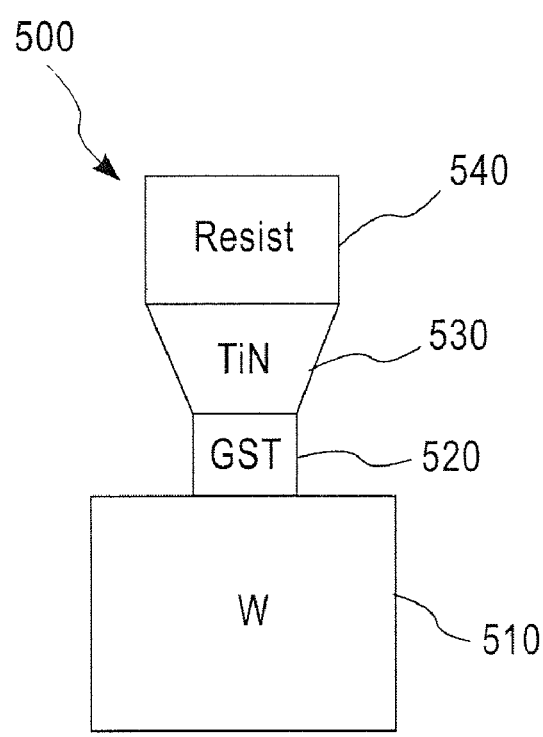

In step 420, the photoresist masking layer 540 is preferably trimmed to be, for example, about two-thirds (⅔) of its originally deposited cross-sectional width, W, thus resulting in the configuration shown in FIG. 5B. In comparison to the ⅓ trimming step 220 used in the illustrative method 200 depicted in FIG. 2, the less aggressive ⅔ trimming step 420 beneficially offers more control across the wafer and improved reliability. In step 430, an anisotropic etching technique, preferably reactive ion etching (RIE), is used to remove portions of the heater layer 530 where the photoresist mask layer 540 is not present. However, in contrast to the etching technique used in step 230 in method 200 (see FIG. 2), here a tapered etch is performed, so that a lower surface of the heater material layer 530 has a cross-sectional width significantly less than the upper surface of the heater material layer. In a preferred embodiment, the cross-sectional width of the upper surface of the heater layer can be approximately twice the cross-sectional width of the bottom surface of the heater layer. The upper surface of the heater material layer 530 preferably remains about ⅔ of its originally deposited cross-sectional width and the lower surface of the heater material layer is preferably about ⅓ of its originally deposited cross-sectional width. Alternative techniques for forming a tapered heater layer are similarly contemplated by the invention.

In step 440, the PC material layer 520 may be etched to approximately the same cross-sectional width as the lower surface of the heater material layer 530. After stripping the photoresist mask layer 540, other processing steps may be performed. For example, a barrier layer (not shown) may be deposited and/or a top electrode layer (not shown) may be formed, e.g. by deposition, photolithography and RIE, or, in an embodiment in which the top electrode layer is copper, by a damascene process (e.g., patterning of silicon dioxide, copper deposition and CMP).

In comparison, the technique shown in FIG. 2 requires a trim of the photoresist mask layer to about ⅓ of its originally deposited cross-sectional width W. As previously explained, such an aggressive trim is not very reliable and is difficult to control in a homogeneous fashion over the wafer. On the other hand, the technique shown in FIG. 4 advantageously reduces the amount of trimming required of the photoresist mask layer in combination with a tapered etch of the heater layer, both of which may be performed in a more reliable manner.

Figure 6:
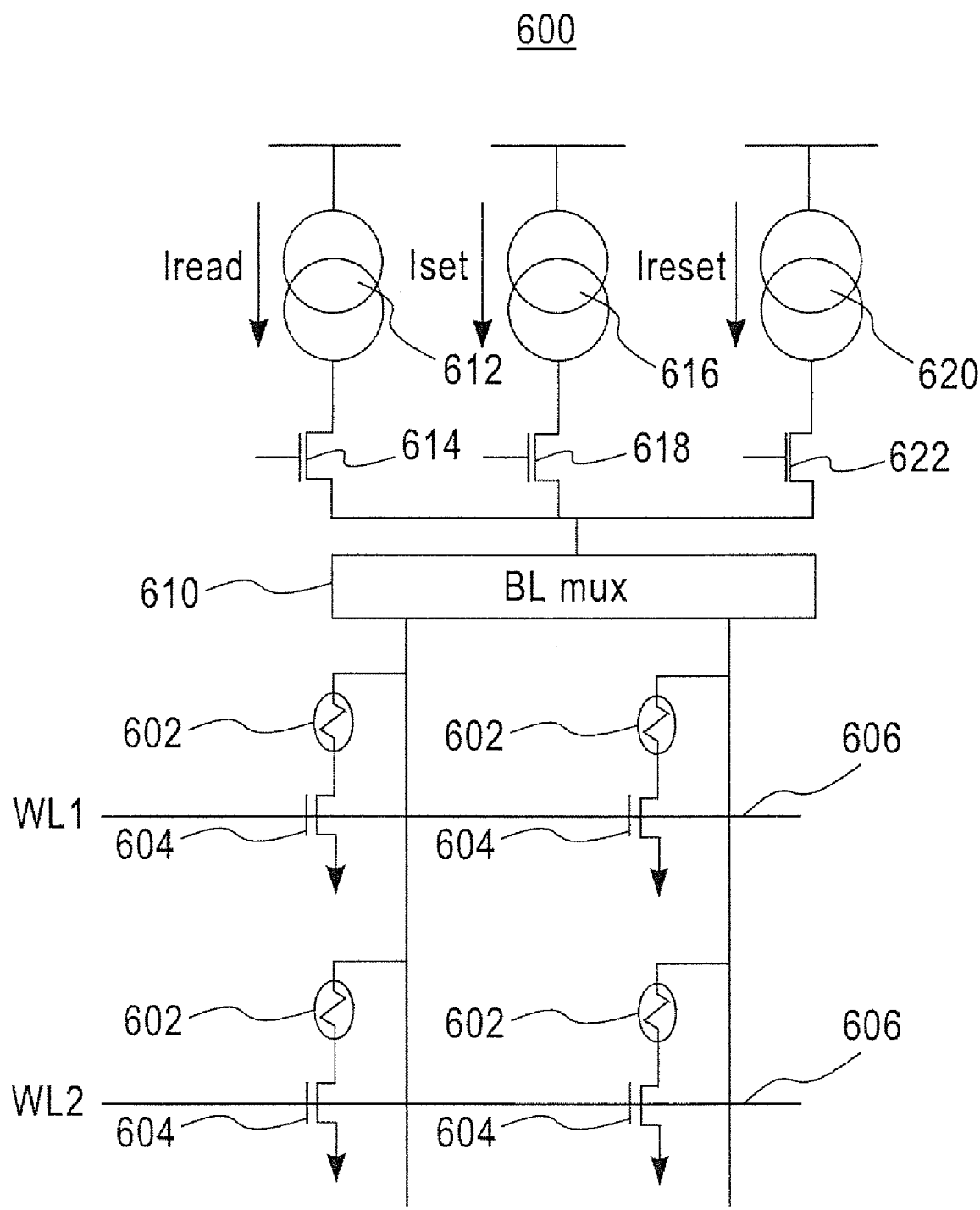
FIG. 6 is a schematic diagram illustrating an exemplary nonvolatile memory circuit in which the PCM cells of the present invention can be employed, in accordance with another aspect of the present invention.

FIG. 6 is a schematic diagram illustrating an exemplary nonvolatile memory circuit 600 in which the PCM cells of the present invention can be employed, in accordance with another aspect of the present invention. The memory circuit 600 preferably comprises a plurality of PCM cells 602, formed in accordance with the techniques of the invention described above, and corresponding access transistors 604 connected thereto. The access transistors 604 are selectively activated by application of appropriate signals, WL1, WL2, to corresponding word lines 606 in the memory circuit 600. Each of the access transistors 604 is preferably operative to connect a first electrode of the corresponding PCM cell 602 to ground, or an alternative voltage source. In an alternative embodiment, diodes or other switching elements may be used as select devices instead of transistors.

Memory circuit 600 further includes a plurality of current sources 612, 616 and 620, supplying currents Iread, Iset and Ireset, respectively, to the PCM cells 602 via a bit line multiplexer (BL mux) 610, or an alternative switching arrangement. Each of the current sources 612, 616, 620 is preferably connected to the multiplexer 610 through a corresponding switch, 614, 618 and 622, respectively, which may comprise a transistor as shown. The current Iread is preferably configured for selectively reading a logical state of the PCM cells 602, while the currents Iset and Ireset are preferably configured for performing a set and reset operation, respectively, for selectively writing a logical state of the cells.

At least a portion of the methodologies of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A phase change memory (PCM) structure configurable for use as a nonvolatile storage element, the PCM structure comprising:
    a substrate;
    at least one bottom electrode on at least a portion of an upper surface of the substrate;
    at least one phase change material layer on at least a portion of an upper surface of the bottom electrode; and
    at least one heater layer on an upper surface of the phase change material layer, wherein the heater layer has a tapered shape such that an upper surface of the heater layer has a cross-sectional width that is greater than a cross-sectional width of a bottom surface of the heater layer contacting the phase change material layer;
    wherein the cross-sectional width of the heater layer contacting the phase change material layer is substantially equal to a cross-sectional width of the upper surface of the phase change material layer.

2. The structure of claim 1, further comprising at least one top electrode on at least a portion of the upper surface of the heater layer.

3. The structure of claim 1, wherein the phase change material layer has a cross-sectional width substantially similar to the cross-sectional width of the lower surface of the heater layer.

4. The structure of claim 1, wherein the cross-sectional width of the upper surface of the heater layer is approximately twice the cross-sectional width of the bottom surface of the heater layer.

5. The structure of claim 1, wherein the cross-sectional width of the bottom surface of the heater layer is approximately one-third of the original cross-sectional width of the heater layer.

6. The structure of claim 1, wherein the cross-sectional width of the upper surface of the heater layer is approximately two-thirds of the original cross-sectional width of the heater layer.

7. The structure of claim 1, wherein the heater material comprises TiN.

8. The structure of claim 1, wherein the phase change material layer comprises at least one chalcogenide.

9. A nonvolatile storage cell, comprising:
    at least one phase change memory (PCM) structure comprising:
    a substrate;
    at least one bottom electrode on at least a portion of an upper surface of the substrate;
    at least one phase change material layer on at least a portion of an upper surface of the bottom electrode;
    at least one heater layer on an upper surface of the phase change material layer, wherein the heater layer has a tapered shape such that an upper surface of the heater layer has a cross-sectional width that is greater than a cross-sectional width of a bottom surface of the heater layer contacting the phase change material layer;
    wherein the cross-sectional width of the heater layer contacting the phase change material layer is substantially equal to a cross-sectional width of the upper surface of the phase change material layer.

10. An integrated circuit including at least one phase change memory (PCM) structure configurable for use as a nonvolatile storage element, the at least one PCM structure comprising:
    a substrate;
    at least one bottom electrode on at least a portion of an upper surface of the substrate;
    at least one phase change material layer on at least a portion of an upper surface of the bottom electrode;
    at least one heater layer on an upper surface of the phase change material layer, wherein the heater layer is formed as a tapered homogeneous conductor structure, an upper surface of the heater layer having a cross-sectional width that is greater than a cross-sectional width of a bottom surface of the heater layer contacting the phase change material layer.

* * * * *